United States Patent [19]

Seidler

[11] Patent Number: 5,090,926
[45] Date of Patent: Feb. 25, 1992

[54] SOLDERABLE LEAD

[75] Inventor: Jack Seidler, Flushing, N.Y.

[73] Assignee: North American Specialties Corporation, Flushing, N.Y.

[21] Appl. No.: 661,252

[22] Filed: Feb. 26, 1991

[51] Int. Cl.$^5$ .............................................. H01R 4/02
[52] U.S. Cl. ..................................... 439/876; 29/843; 439/83
[58] Field of Search ................................ 435/83, 876

[56] References Cited

U.S. PATENT DOCUMENTS 4,357,069  11/1982  Milora .............................. 439/876 X
4,900,279   2/1990  Dennis .............................. 439/83 X Primary Examiner—Eugene F. Desmond
Attorney, Agent, or Firm—Darby & Darby

[57] ABSTRACT

A solderable lead is fashioned with a C-shaped contact portion along its length. The interior of the C-portion is dimensioned to receive and resiliently contact a substrate at a predetermined contact pad. A layer of solder is provided on the exterior of the C-shaped contact portion and extends around its edge. During heating, the solder migrates to the interior of the C-portion by capillary action to the area between the contact pad of the substrate and the interior of the C-portion. While the solder is liquid, the C-portion maintains engagement with the substrate.

7 Claims, 1 Drawing Sheet

SOLDERABLE LEAD

BACKGROUND OF THE INVENTION

The present invention relates to solderable terminals and leads, particularly solder clips intended for connection to contact pads on edges of substrates.

Several leads exist in the market in the form of a clip adapted resiliently to engage the edges of a substrate, while a mass of solder is held on the clip adjacent the position of a conductive area or pad on the substrate. Upon heating the substrate/terminal assembly, the solder mass melts and is drawn, usually by capillary action, to the area of contact between the terminal and the substrate conductive area. Examples of such solderable clips are shown in U.S. Pat. Nos. 4,120,558; 4,019,803; 4,203,648; 4,357,069; 4,367,910; 4,592,617; 4,605,278; 4,697,865; 4,728,305; and 4,780,098. Unfortunately, these terminals generally involve complex structures, such as curved fingers or tabs, for forming the lead and holding the solder mass in place until the assembly is heated, requiring specialized tooling and production techniques.

A device disclosed in U.S. Pat. No. 4,900,279 to Dennis partially solves this problem. This devices uses a basically C-shaped clip that is coated on the interior of the C with solder. The substrate is inserted into the interior of the C, bringing the contact pads of the substrate in contact with the solder, which is then melted, forming when re-solidified a mechanical and electrical connection between the clip and the substrate. Unfortunately, when the solder melts, the significant layer of liquid solder between the clip and the substrate create an unstable hold on the substrate. The substrate tends to float or slide around in relation to the clip during this period. This can potentially lead to a solder connection of the clip to an area partially or completely off of its desired contact pad, which may cause a short-circuit to an adjacent, closely spaced contact pad.

SUMMARY OF THE INVENTION

Thus, it is an object of the invention to provide an improved simple solderable terminal having an easily applied and relatively nearby source of solder, while providing a firm grasp on a corresponding substrate throughout the soldering process.

It is a further object of the invention that the solder terminal be easily and simply fabricated with a minimum of manufacturing steps.

In accordance with the invention, a solderable lead is fashioned with a C-shaped contact element formed along its length. The interior of the C-element is dimensioned to receive and resiliently engage a substrate at a predetermined contact point such as a contact pad on the substrate. A layer of solder is provided on the exterior side of the C-element. During heating, the solder migrates to the interior of the C-element by capillary action to the area between the contact pad of the substrate and the C-element. Thus, while the solder is liquid, the resilient C-element holds the lead engaged with the substrate. To aid in the migration of the solder, the side edges of the layer of solder are curved toward the interior of the C-element by simple expedients during manufacture.

The foregoing and other objects and advantages of this invention will become apparent to those skilled in the art upon reading the detailed description of a preferred embodiment in conjunction with a review of the appended drawings.

DETAILED DESCRIPTION OF THE PREFERRED EMBODIMENTS

Figure 1:
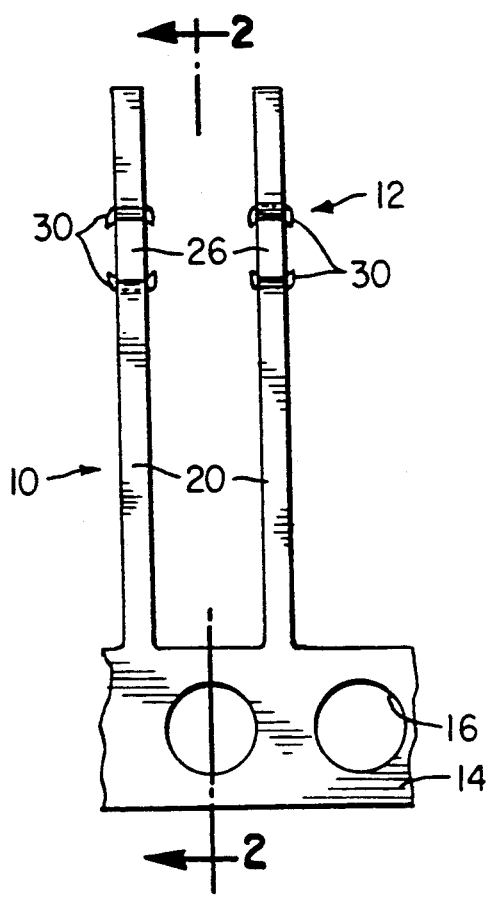
FIG. 1 is a front view of a fragment of a conductive strip shoWing two solderable leads according to the invention connected to a carrier strip.
Figure 2:
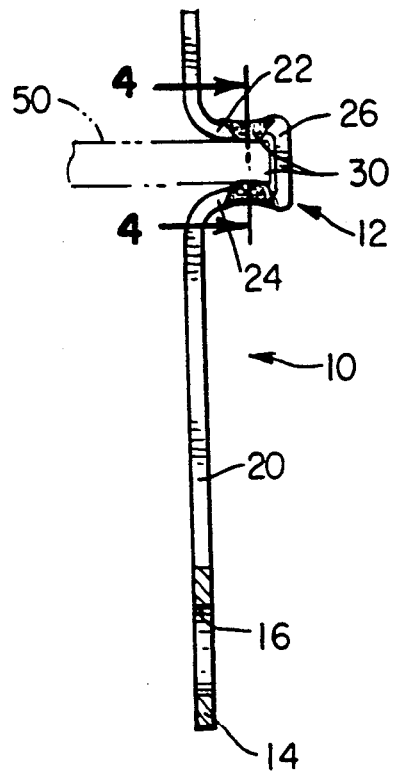
FIG. 2 is a side view of a solderable lead according to the invention, taken along the line 2—2 of FIG. 1.

FIGS. 1 and 2 show a preferred embodiment of the invention in the form of a series of leads 10 each having a C-clip 12 for receiving and grasping a substrate 50 (such as a printed circuit board, integrated circuit, chip carrier or the like). The leads 10 are formed from a continuous strip 11 of semi-resilient conductive material through a series of steps, such as by progressive stamping, including punching and bending.

Figure 3:
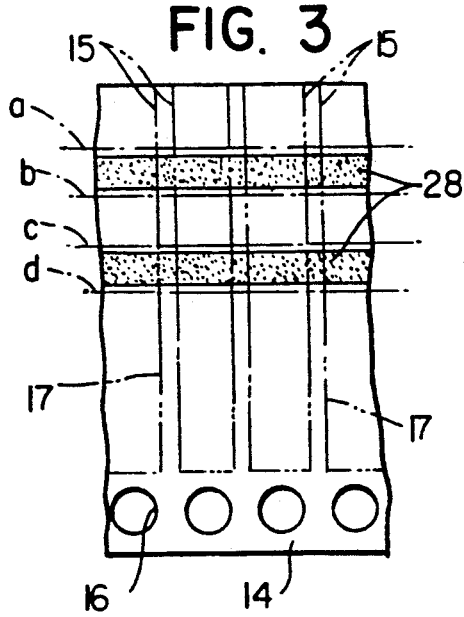
FIG. 3 is a rear view of a fragment of a conductive strip during manufacture of solderable leads according to the invention.

FIG. 3 shows a fragmentary portion of the strip 11 from which the leads 10 are formed. The semi-resilient conductive material (such as beryllium copper) has two bands of solder 28 secured thereto, such as by cold welding the solder bands 28 to the conductive strip 11. Other methods of applying the solder bands 28 to the strip 11 may of course by used.

The strip 11 is punched at lines 15 to form the individual lead bodies 17. Indexing holes 16 are also punched along the edge of strip 11 to form a carrier strip 14.

During manufacture, the leads 10 remain connected to the carrier strip 14. The indexing holes 16 are used to move the leads 10 through a manufacturing apparatus such as a progressive stamping machine, and to maintain the precise inter-lead spacing necessary for the leads 10 to mate with respective similarly spaced contact pads 18 on the substrate 50. Extending from the carrier strip 14 for each lead 10 is an elongated body portion 20 for eventual connection of the lead 10 to other electronic components.

Adjacent the end of the body portion 20 remote from the carrier 14 is the C-clip 12. The C-clip 12 is formed of four generally right angle bends, the two outer bends being convex with respect to the front of the lead 10, while the two inner bends are concave. The bends may be formed at the lines marked "a", "b", "c", and "d" on FIG. 3. The lengths of the top and bottom walls 22,24 of the C-clip 12, as well as the length of the rear wall 26 are determined by the thickness of the substrate 50 on which the clip 12 is to be mounted and the positioning of the contact points 18 thereon.

As pointed out above, preferably before the leads 10 are punched from the sheet 11 of stock material, the bands of solder 28 are deposited on the back side of the leads 10 in the area that is to be bent into the C-clip 12. Alternatively, the solder bands 28 may be formed in a single band, adapted to cover not only the top and bottom walls 22,24 of the C-clip 12, but also its rear wall 26. Where connection is desired to only one contact pad 18 on one side of substrate 50, a corresponding one of the solder bands 28 may be omitted. The solder bands 28 are thick enough to provide a sufficient amount of solder to positively connect the C-clip 12 to the contact pad 18 of the substrate 50 after heating.

Figure 4:
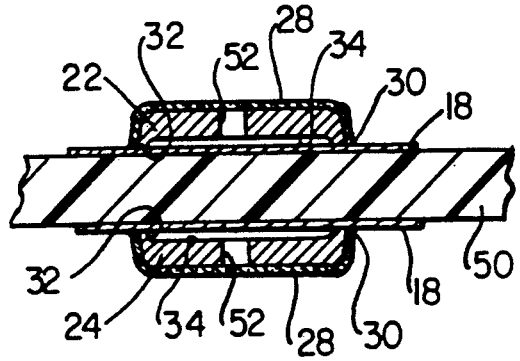
FIG. 4 is a cross-section of the contact portion of the solderable lead, mounted on a substrate, viewed along line 4—4 of FIG. 2.

According to a feature of the invention, the flow of solder to the contact pad is facilitated by specially forming the solder band or bands 28 on the individual lead 10. Thus, when the lead 10 is punched from the sheet 11, a portion of solder 30 is caused to extend laterally beyond the width of the body 20 and is curved toward the interior of the C-clip 12, to cover not only the exterior face of the C, but also the edges on either side. This may be done by causing the punch/die combination that forms the leads 10 as shown in FIG. 3 to have a slightly larger than normal tolerance, which creates a burr 30 at the edges of the lead 10. In so doing, the malleable solder curves around the lead 10 to cover the sides of the lead 10 as shown at 30 in FIG. 4. Depending on the actual tolerance of the punch/die combination, some of the sheet material 11 may also be bent in a burr 32 toward the interior of the C-clip 12. As can be seen in FIG. 4, this may cause the main area of the C-clip 12 to be held slightly away from the surface of the contact pad 18 of the substrate 50 to form a very narrow gap 34.

In assembly, a comb-like section of the carrier strip 14 with a desired number of leads 10 (for example, 10 to 50 in various applications) is engaged over the edge of a substrate 50. The leads 10 are spaced in correspondence with the spacing of the contact pads 18 on the substrate 50, which may be on either side or both sides of the substrate 50. Each C-clip 12 then resiliently engages a corresponding substrate contact pad 18, and the leads 10 are thereby held in proper position with respect to the substrate 50 for further operations.

After the substrate is engaged with the C-clip 12, as shown in FIG. 4, the clip/substrate assembly is moved through a heater, which melts the solder layer 28. The liquid solder will migrate by capillary action into the intervening gap 34 between the C-clip 12 and the contact point 18. The gap 34 caused by a burr 32 on the lead edges improves the capillary action causing the solder to flow between the C-clip 12, and contact point 18 to improve the soldered bond. However, even without any significant burr 32, the solder will still sufficiently migrate into the space between the C-clip 12 and the contact pad 18 because of inevitable irregularities between the C-clip 12 and the contact pad 18 when they are engaged.

While the solder migrates, the top and bottom walls 22,24 of the C-clip 12 or the burrs 32 will remain in contact with the contact point 18, retaining the clip in engagement with the substrate 50. On cooling, the solder will re-solidify, forming a solid solder joint between the C-clip 12 and the substrate 50. In this way, difficulties of relative movement of clip and substrate, which may be caused in the arrangement shown in the prior Dennis U.S. Pat. No. 4,900,279, are avoided, and the lead 10 is fixed to the substrate 50 at the desired point.

After joining the set of leads 10 to the substrate contact pads 18, the carrier strip 14 is cut off. When this is done adjacent the point where the lead body joins the carrier strip, the end of the body 20 previously near the carrier 14 may be used as a terminal. This terminal portion may take any desired configuration. It may, for example, be formed as a pin to be received in a connector or in an opening of a further printed circuit board or the like, so as for example to be soldered thereto, or as a wire-wrap post. Alternatively, the portions of lead 10 beyond the C-clip (above it in FIG. 2) may be configured to be used as the terminal portion.

As an optional improvement, small apertures 52 may be formed in the lead 10 underneath the solder layer 28, which will facilitate flow of molten solder into the gap 34, by capillary action, without significantly weakening the lead 10.

It will be understood that instead of forming a burr at the edge of the C-clip portion, that portion of the lead body may be bowed slightly above a longitudinal axis, to be slightly concave facing inwardly to provide the space 34 between the C-clip interior and the substrate conductive pad.

While the embodiment of the invention shown and described is fully capable of achieving the results desired, it is to be understood that this embodiment has been shown and described for purposes of illustration only and not for purposes of limitation. It will be apparent to those skilled in the art that variations and modifications can be substituted herein without departing from the principles and true spirit of the invention, which is defined by the accompanying claims.

What is claimed is:

1. A solderable lead for connection to a device having a conductive area, comprising:
   a substantially flat elongated body, said body having a curved contact portion having an interior and an exterior, said interior being adapted to receive said device and to resiliently contact said conductive area of said device; and
   a layer of solder overlying said curved portion exterior and having a portion extending around the edge thereof and immediately adjacent said curved portion interior, but without having solder in said interior of the curved portion, whereby upon heating, said layer of solder will liquefy and migrate to form a soldered joint between said interior and said conductive area.

2. A solderable lead according to claim 1, wherein said curved contact portion is a C-shaped clip portion having top, rear and bottom walls.

3. A solderable lead according to claim 2, wherein said portion of said solder layer covers an edge of one of said top and bottom walls.

4. A solderable lead according to claim 3, wherein portion of said clip portion under said solder layer is curved toward said curved portion interior.

5. A solderable lead according to claim 3, wherein said C-shaped portion has a burr at the edge thereof, said solder layer extending over the edge of said burr.

6. An assemblage of leads, each as in claim 1, each lead being integral with a carrier strip and said leads being uniformly spaced along said carrier strip.

7. The method of producing a lead soldered to a conductive pad of a substrate comprising the steps of:
   providing a lead as in claim 1;
   resiliently maintaining said curved portion interior in contact with said substrate conductive area;
   heating said lead to melt said solder layer and cause said solder to flow around the edge of said lead into the region between said curved portion interior and said conductive area;
   whereby on cooling, said conductive pad is soldered to said curved portion interior.

* * * * *